(12) United States Patent
Shirasaki

(10) Patent No.: US 9,268,213 B2
(45) Date of Patent: Feb. 23, 2016

(54) PELLICLE FOR LITHOGRPAHY

(71) Applicant: SHIN-ETSU CHEMICAL CO., LTD., Tokyo (JP)

(72) Inventor: Toru Shirasaki, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 186 days.

(21) Appl. No.: 14/098,652

(22) Filed: Dec. 6, 2013

(65) Prior Publication Data

US 2014/0178805 A1    Jun. 26, 2014

(30) Foreign Application Priority Data

Dec. 25, 2012  (JP) ................................. 2012-280600

(51) Int. Cl.
*G03F 1/62* (2012.01)
*G03F 1/64* (2012.01)
*G03F 1/00* (2012.01)

(52) U.S. Cl.
CPC . *G03F 1/64* (2013.01); *G03F 1/142* (2013.01)

(58) Field of Classification Search
CPC ..................................... G03F 1/62; G03F 1/64
USPC ................................................. 430/5; 428/14
See application file for complete search history.

(56) References Cited

U.S. PATENT DOCUMENTS

2009/0246646 A1*   10/2009   Hamada ........................... 430/5

FOREIGN PATENT DOCUMENTS

JP      61-241756 A      10/1986
JP      9-187746 A        7/1997

OTHER PUBLICATIONS

Office Action dated Jun. 29, 2015, issued in counterpart Japanese Patent Application No. 2012-280600, with translation of relevant parts (5 pages).

* cited by examiner

*Primary Examiner* — Stephen Rosasco
(74) *Attorney, Agent, or Firm* — Westerman, Hattori, Daniels & Adrian, LLP

(57) ABSTRACT

There is provided a pellicle wherein the frame is cut with one or more slight-chamfers, and in particular the one cut along the inner edge of the upper annular face of the frame, to which the pellicle membrane is glued, has a slope greater than 45 degrees so that the pellicle membrane when slackened does not touch the lower ridge of the slight chamfer.

2 Claims, 5 Drawing Sheets

PELLICLE FOR LITHOGRPAHY

The present non-provisional patent application claims priority, as per Paris Convention, from Japanese Patent Application No. 2012-280600 filed on Dec. 25, 2012, the disclosure of which is hereby incorporated by reference herein in its entirety.

FIELD OF THE INVENTION

The present invention relates to a pellicle for lithography which is used as a dust fender for a mask for lithography employed in the scenes of manufacturing semiconductor devices such as LSI and Super-LSI, and liquid crystal display panels, etc.

BACKGROUND TECHNOLOGY

In recent years, the design rule for LSI has been progressively adopting more micronized orders of sub-quarter micron, and as a result the shortening of the wavelength of the exposure light source has been compelled. Thus, the exposure light source has been shifted from g-line (436 nm) and i-line (365 nm) lights of the heretofore commonly used mercury lamp to KrF excimer lasers (248 nm) and ArF excimer lasers (193 nm).

In manufacturing semiconductor devices such as LSI and super-LSI or in manufacturing a liquid crystal display board, a pattern is made by irradiating a light to a semiconductor wafer or an original plate for liquid crystal; however, if a dust adheres to a mask for lithography (also simply referred to as "mask") or a reticle (these are collectively referred to as "exposure original plate" herein below) used in this pattern creating stage, the dust absorbs light or bends it, causing deformation of a transferred pattern, roughened edges or black stains on a base, and leads to problems of damaged dimensions, poor quality, deformed appearance and the like. Now, we will explain this by taking a mask for example.

The above-mentioned lithography works are usually performed in a clean room, but even so, it is still difficult to keep the exposure original plate clean all the time; therefore, in general the light irradiation is carried out only after a surface of the exposure original plate is sheltered by a pellicle. In this way, the dust particle is prevented from directly adhering to the surface of the exposure original plate but is caught on the pellicle, and if, at the time of the lithography, the exposure light is focused on the pattern described on the exposure original plate the dust particle on the pellicle does not partake in the image transferring.

In general, a pellicle is mainly built up of a pellicle frame, a pellicle membrane and an agglutinant layer; and the pellicle membrane is attached to an annular face of the pellicle frame via an adhesive in a slack-free manner, and the agglutinant layer for agglutinating the pellicle to an exposure original plate is formed on another annular face of the pellicle frame. The pellicle membrane is made of cellulose nitrate, cellulose acetate and a fluorine-containing polymer or the like which transmit well such lights that are used in light exposure (e.g., g-line [430 nm], i-line [365 nm], KrF excimer laser [248 nm], and ArF excimer laser [193 nm]).

To attach the pellicle membrane to the pellicle frame, a solvent that dissolves the pellicle membrane well is applied to one of the two annular faces (hereinafter referred to as "upper annular face") and, after pasting the pellicle membrane on it, the solvent and the membrane are dried by air flow, or alternatively an adhesive agent such as acrylic resin, epoxy resin and fluorine-containing resin is used to fix the pellicle membrane on the upper annular face of the pellicle frame. On the other hand, the other one of the two annular faces (hereinafter referred to as "lower annular face") is laid with the agglutinant layer made of a polybutene resin, a polyvinyl acetate resin, an acrylic resin and a silicone resin or the like for agglutinating the pellicle frame to the exposure original plate, and on this agglutinant layer is laid a releasable liner for protecting the agglutinant layer if it is required.

The pellicle as described above is installed for the purpose of preventing the dust from adhering to the exposure original plate, and the installation is effected as the agglutinant layer of the pellicle is pressed upon the exposure original plate, whereby a closed space defined by the pellicle membrane, the pellicle frame and the exposure original plate is created in a manner such that the pellicle frame entirely surrounds the pattern region formed in the surface of the exposure original plate. Thus, the pattern region is isolated from the external atmosphere by means of the pellicle so that the dust outside the pellicle cannot reach the pattern region.

However, although such a protective pellicle can prevent entrance of any dust particle after the pellicle is installed, there is a possibility that some dust particles are already adhering to the pellicle membrane or the inner wall of the pellicle frame as of the time of pellicle installation. It is normally possible to detect a dust particle on the pellicle membrane if its size is no smaller than about 0.3 micrometer, so that most of the dust particles can be removed from the pellicle membrane through detection; however, with regard to the dust particle adhering to the inner wall of the pellicle frame, it is not possible to detect it unless it is 10 micrometers or larger, so that no small number of dust particles having a size of less than 10 micrometers may exist on the inner wall of the frame, which have escaped the detection, and these undetected dust particles may fall on the exposure original plate during the use of the pellicle, and cause problems.

IP Publication 1 discloses a technology to solve this kind of problem, according to which the frame of the pellicle is coated with an adhesive such as epoxy resin whereby the undetectable dust particles adhering to the pellicle frame are stuck and immobilized by the adhesive lest they should fall onto the pattern face.

[Prior Art]
[IP Publication]
[IP Publication 1]
Japanese Pre-Grant Publication S61(1986)-241756

SUMMARY OF THE INVENTION

Problems the Invention Seeks to Solve

The present inventor studied the pellicle for lithography further and found that, besides the above-described problem concerning the dust particles that are adhered to the pellicle frame, there is a problem that the pellicle membrane is scarred in the vicinity of the pellicle frame while the pellicle is handled such as when the pellicle is installed in a lithography system.

Therefore, it is an object of the present invention to provide a pellicle for lithography which is not liable to be scarred even when the tautness of the pellicle membrane undergoes a decrease and the pellicle membrane is slackened during a time of pellicle handling.

Means to Solve the Problems

The present invention is characteristic in that in a pellicle for lithography comprising a pellicle membrane and a pellicle frame, to the upper annular face of which the pellicle membrane is tensely adhered, the angle of the slight-chamfering along the inner edge of the upper annular face of the frame to which the pellicle membrane is adhered is less than 45 degrees. Now, this angle of the slight-chamfering is defined as the smaller of angles included between the chamfer face and the imaginary plane that contains the inner wall of the pellicle frame.

It is preferable in the present invention if the angle of the slight-chamfering along the inner edge of the upper annular face of the pellicle frame is 10-30 degrees, and/or a distance between the two corners of the same chamfering as measured by seeing the chamfering from right above the upper annular face of the frame is 0.2-0.3 mm. (hereinafter this distance is referred to simply as "chamfer's horizontal distance")

Effects of the Invention

According to the present invention, the angle of the slight-chamfering along the inner edge of the upper annular face of the frame is made less than 45 degrees so that an upper edge of the inner wall of the pellicle frame is positioned afar from the pellicle membrane with a favorable consequence that even when the tautness of the pellicle frame has undergone a decrease and the membrane is slackened, the pellicle membrane is far less liable to touch the upper edge of the inner wall of the pellicle frame so that the pellicle membrane becomes substantially safe from incurring scars.

EXAMPLES TO EMBODY THE INVENTION

Now, an example of the present invention is described with reference to the drawings attached, but the present invention shall not be confined to such description.

Figure 1:
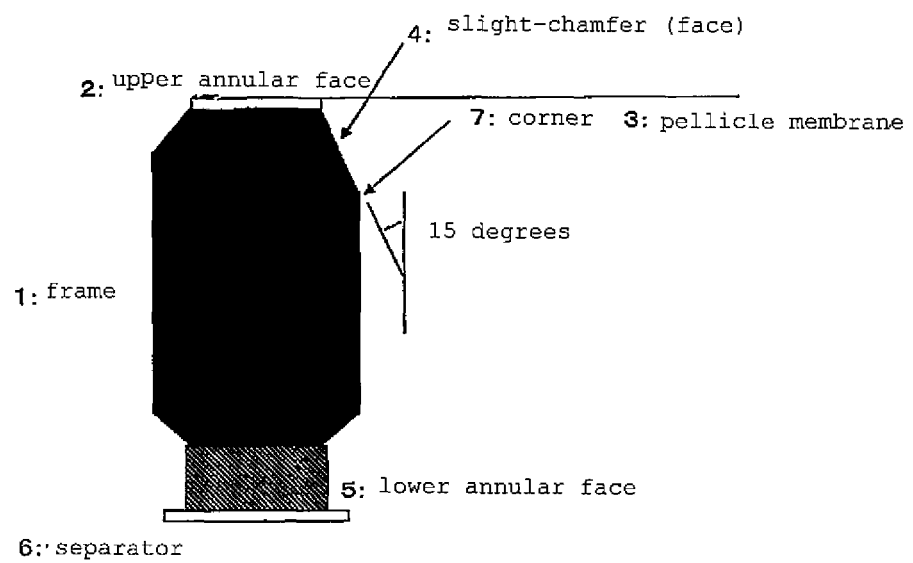
FIG. 1 This is an enlarged view taken in the vicinity of the frame 1 of a pellicle for lithography according to the present invention.
Figure 2:
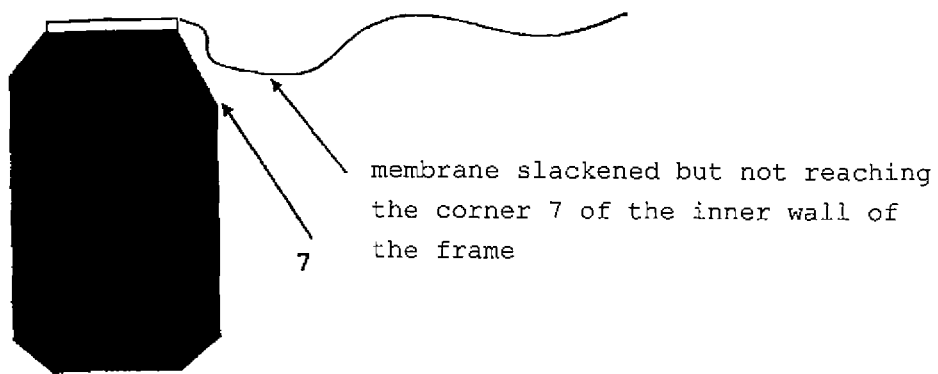
FIG. 2 This is an enlarged view to show a positional relation, in a pellicle according to the present invention, between the upper edge of the inner wall of the pellicle frame 1 and the pellicle membrane 3 as of a time when the pellicle membrane 3 undergoes slackening.

A pellicle for lithography according to the present invention is generally composed, as shown in FIG. 1, of a pellicle membrane 3, a pellicle frame 1, a mask-bonding agglutinant 5, etc. The pellicle membrane 3 is tensely adhered to the upper annular face of the pellicle frame 1 and the mask-bonding agglutinant 5 is laid on the lower annular face of the pellicle frame 1 for agglutination of the pellicle frame 1 to the exposure original plate, and if need be a separator 6 is attached to cover the agglutinant surface. Now, in this example of the present invention, "exposure original plate" is used as the "mask" but the invention is equally applicable if the mask is a reticle.

A pellicle frame 1 such as the one used in the present invention is in general made of a metal like aluminum alloy, and it is shaped by machining such as cutting and in the consequence it acquires burr at the corner edges, or even without burr the edged corners of a metal product which have been machined by cutting would have such sharpness that it can cut like a knife and, thus, to avoid injuries the corner edges of the frame 1 are, in general, machined to acquire a slight chamfer whereby the sharp edge is replaced by an obtusely angled chamfer face.

Figure 3:
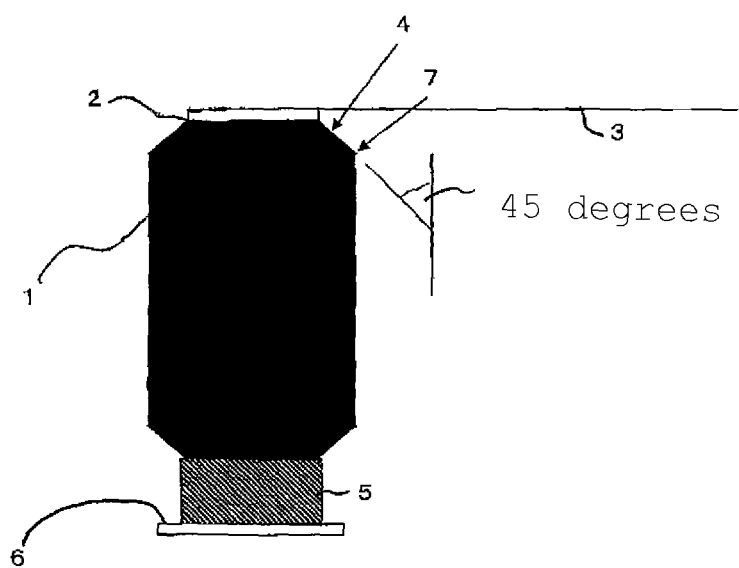
FIG. 3 This is an enlarged view taken in the vicinity of the frame 1 of a conventional pellicle for lithography.

In the case of a conventional pellicle frame for lithography, the slight-chamfer machined usually has a chamfer's horizontal distance of 0.2 mm and an angle of chamfer of at least 45 degrees. FIG. 3 is an enlarged view showing a conventional pellicle frame 1 wherein a slight-chamfer having a chamfer's horizontal distance of 0.2 mm and an angle of slight-chamfer of 45 degrees is cut.

Figure 4:
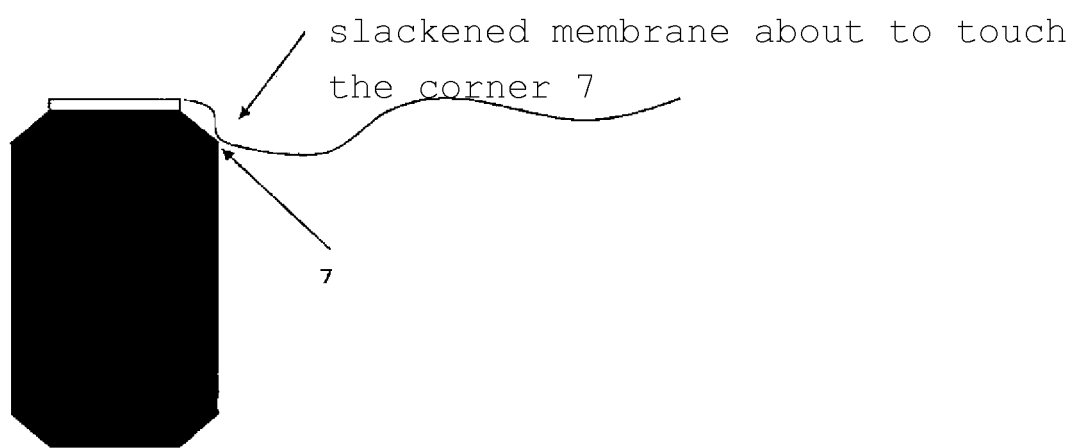
FIG. 4 This is an enlarged view to show a situation, in the case of a conventional pellicle, wherein the pellicle membrane 3 is slackened and comes in contact with the upper edge of the inner wall, which is a corner 7 of a slight-chamfering 4.
Figure 5:
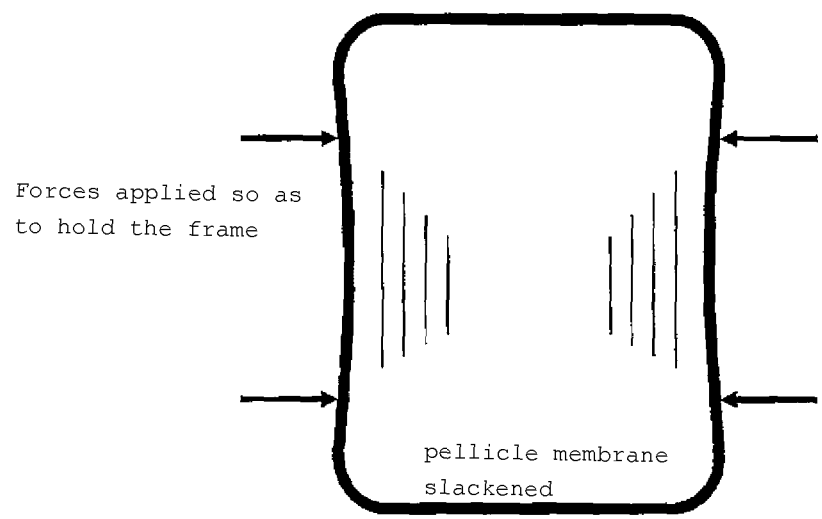
FIG. 5 This is a view to show how a pellicle membrane 3 is slackened when a frame 1 of a pellicle for lithography is held.

When a pellicle for lithography is handled, the handling is usually carried out while the frame 1 is held by its side faces, and on this occasion if the holding force is large, as shown in FIG. 5, the frame 1 warps inwardly so that the tautness of the pellicle membrane 3 is lowered and the pellicle membrane 3 itself slackens. FIG. 4 shows a positional relation between the slackened pellicle membrane 3 and the pellicle frame 1 in the case of a conventional pellicle frame 1, and it is seen that the slackened pellicle membrane 3 is about to contact a corner 7 of the 45-degree slight-chamfer 4, which is made at the edge joining the upper annular face and the inner wall of the frame 1.

The present inventor discovered that when the frame 1 is released from the holding while the pellicle membrane 3 is in contact with the corner 7 of the slight-chamfer 4, the recovered tension of the pellicle membrane 3 snatches the membrane 3 off the corner 7 with a result that a scar occurs in the membrane 3, and thus invented a pellicle in which the corner 7 of the pellicle frame is substantially removed from the pellicle membrane 3.

In particular, the present invention is characterized in that—in order to situate the corner 7 of a slight-chamfer 4 made at the edge joining the upper annular face and the inner wall of the frame 1 remote from the pellicle membrane 3—the slight-chamfer 4 is made to have a chamfer's horizontal distance of 0.2 mm-0.3 mm and/or an angle of slight-chamfering of smaller than 45 degrees, or preferably of 10-30 degrees. In preferable manners of embodying the invention, the chamfer's horizontal distance is restricted to 0.2-0.3 mm and the angle of the slight-chamfering is made smaller than 45 degrees, for example 15 degrees, so that it is way possible to situate the corner 7 of the chamfer lower than a lowest point to which the slackened pellicle membrane 3 would be able to droop, and hence the corner 7 is securely kept from being touched by the pellicle membrane 3. On the other hand, in a less preferable embodiment the angle of slight-chamfering is made smaller than 10 degrees, and although the corner 7 is situated sufficiently remote from the pellicle membrane 3, the area of the slight-chamfering becomes way larger pushing up the machining cost higher without bringing about justifiable results so that it is preferred that the slight-chamfer is not smaller than 10 degrees.

Example 1

Now we will explain about an example of the present invention. A pellicle frame 1 according to the present invention was made of an aluminum alloy, and it had an outward dimension of 149 mm by 115 mm by 4.5 mm, with a horizontal thickness of 2 mm, and the inner edge of its upper annular face (or the upper edge of the inner wall) of the frame 1 was formed with a slight-chamfer 4 having an angle of the slight-chamfering of 15 degrees and a chamfer's horizontal distance of 0.2 mm.

Then, a silicone agglutinant (X-40-3122, a product name of Shin-Etsu Chemical Co., Ltd.) was applied to the lower annular face of the pellicle frame 1, which was immediately thereafter heated by electromagnetic induction heating to 180 degrees C., whereby the solvent of the agglutinant was expelled. As of then the thickness of the agglutinant layer 5 was 0.3 mm. A separator 6 was applied to the exposed face of agglutinant layer 5.

A CYTOP adhesive (CTX-A, a product name of ASAHI GLASS CO., LTD) was applied to the upper annular face of the pellicle frame 1, which was immediately thereafter heated to 130 degrees C., whereby the adhesive layer 2 was cured. Thereafter, the adhesive-bearing upper annular face of the pellicle frame 1 was bonded to a preformed pellicle membrane 3 made of a CYTOP (CTX-S, a product name of ASAHI GLASS CO., LTD), which was attached to and supported by a temporary aluminum frame having a greater expansion than the pellicle frame 1, and subsequently the portion of the pellicle membrane 3 which extended beyond the outer edge of the pellicle frame 1 was removed and a pellicle for lithography of the present invention was completed.

A pair of parallel side bars of this completed pellicle frame 1 were held and the bars were pressed inwardly until the pellicle membrane 3 started slackening, and then the pressure was removed and the pellicle membrane 3 regained its tension and was taut again. When this pellicle membrane 3 was observed as it was irradiated with a condensed light lamp, no scar resulting from a contact with the frame 1 was found.

Comparative Example

As a comparative frame, a pellicle frame was made of the same aluminum alloy as Example 1, and it also had an outward dimension of 149 mm by 115 mm by 4.5 mm, with a horizontal thickness of 2 mm. In this comparative example, a slight-chamfer 4 having an angle of the slight-chamfering of 45 degrees and a chamfer's horizontal distance of 0.2 mm was formed along the inner edge of the upper annular face of the pellicle frame. The same subsequent procedures as in Example 1 were observed.

A pair of parallel side bars of this comparative pellicle frame were held and the bars were pressed inwardly until the pellicle membrane 3 started slackening, and then the pressure was removed and the pellicle membrane 3 regained its tension and was taut again. When this comparative pellicle membrane 3 was observed as it was irradiated with a condensed light lamp, a scar thought to result from a contact with the frame 1 was found in the pellicle membrane 3.

INDUSTRIAL APPLICABILITY

The pellicle of the present invention is capable of reducing the scar in the pellicle membrane attributable to a contact between the membrane and the pellicle frame, whereby the rate of defective pellicle is reduced; thus the present invention is very useful in the industry.

EXPLANATION OF REFERENCE NUMERALS

1: pellicle frame
2: upper annular face of the frame, to which the pellicle membrane is adhered
3: pellicle membrane
4: slight-chamfer (face) made along the inner edge of the upper annular face of the frame
5: lower annular face of the frame, to which agglutinant is applied
6: separator
7: a corner forming a boundary between the slight-chamfer face and the inner wall of the pellicle frame

What is claimed is:

1. A pellicle for lithography comprising:
   (i) a pellicle membrane; and
   (ii) a pellicle frame, to an upper annular face of which the pellicle membrane is tensely adhered, wherein the angle of a slight-chamfering formed along an inner edge of the upper annular face of the pellicle frame to which the pellicle membrane is adhered is 10 degrees or greater but less than 30 degrees with respect to a vertical surface of the pellicle frame.

2. A pellicle as claimed in claim 1, wherein a chamfer's horizontal distance is 0.2 through 0.3 mm.

* * * * *